United States Patent
Tebbe et al.

(10) Patent No.: US 6,770,159 B1
(45) Date of Patent: Aug. 3, 2004

(54) METHOD OF FABRICATING AN RF SUBSTRATE WITH SELECTED ELECTRICAL PROPERTIES

(75) Inventors: Dennis Tebbe, Melbourne, FL (US); Thomas Smyth, Palm Bay, FL (US); Terry Provo, Indialantic, FL (US); Dara Ruggiero, Melbourne, FL (US); Holly Todd, Barefootbay, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/397,114

(22) Filed: Mar. 26, 2003

(51) Int. Cl.$^7$ ............................................. B32B 31/10
(52) U.S. Cl. ................. 156/89.11; 156/89.12; 156/153; 156/263; 156/265; 156/297; 156/299
(58) Field of Search ............ 156/89.11, 89.12, 156/153, 263, 264, 265, 266, 297, 299

(56) References Cited

U.S. PATENT DOCUMENTS 5,869,894 A * 2/1999 Degani et al. ............... 257/723

6,036,798 A * 3/2000 Nishide et al. .......... 156/89.12

FOREIGN PATENT DOCUMENTS

JP 9-260105 * 10/1997

* cited by examiner

Primary Examiner—Melvin C. Mayes
(74) Attorney, Agent, or Firm—Sacco & Associates, PA

(57) ABSTRACT

The method includes selecting two or more types of ceramic materials (202, 204), each having a distinct set of electrical properties different from the other of the types of ceramic materials. A substrate pattern can also be selected. The substrate pattern can comprise at least two types of distinct substrate areas having the distinct sets of electrical properties of the ceramic materials. Each distinct area can be selected so as to have dimensions much smaller than a wavelength at a frequency of interest. The ceramic materials (202, 204) can thereafter be fired and then cut into a size and shape consistent with the distinct areas to form dielectric pieces (206, 208). The process continues by selectively arranging the dielectric pieces on a base plate (302) in accordance with the pattern to form the textured ceramic dielectric substrate. The completed textured substrate (400) will have at least one effective electrical property at a frequency of interest that is different from each of said distinct sets of electrical properties of the ceramic materials.

27 Claims, 5 Drawing Sheets

METHOD OF FABRICATING AN RF SUBSTRATE WITH SELECTED ELECTRICAL PROPERTIES

STATEMENT REGARDING FEDERALLY SPONSORED RESEARCH OR DEVELOPMENT

The United States Government has rights in this invention pursuant to Contract No. F005521 between the Defense Advanced Research Projects Agency, the United States Naval Research Laboratory and Harris Corporation.

BACKGROUND OF THE INVENTION

1. Statement of the Technical Field

The invention concerns dielectric substrates for RF circuits, and more particularly dielectric substrates with selectively tailored electrical properties.

2. Description of the Related Art

RF circuits, including antennas, are commonly implemented on dielectric substrates. Materials commonly used for this purpose include commercially available low and high temperature cofired ceramics (LTCC, HTCC). For example, low temperature 951 cofire Green Tape™ from Dupont® is Au and Ag compatible, has a acceptable mechanical properties with regard to thermal coefficient of expansion (TCE), and relative strength. It is available in thicknesses ranging from 114 μm to 254 μm and is designed for use as an insulating layer in hybrid circuits, multichip modules, single chip packages, and ceramic printed wire boards, including RF circuit boards. Similar products are available from other manufacturers.

LTCC substrate systems commonly combine many thin layers of ceramic and conductors. The individual layers are typically formed from a ceramic/glass frit that can be held together with a binder and formed into a sheet. The sheet is usually delivered in a roll in an unfired or "green" state. Hence, the common reference to such material as "green tape". Conductors can be screened onto the layers of tape to form RF circuit elements, antenna elements and transmission lines. Two or more layers of the same type of tape is then fired in an oven. The firing process shrinks all of the dimensions of the raw part. Accordingly, it is highly important that the material layers all shrink in a precise, well defined way that will provide consistent results from one module to the next.

Due to the maturing of the antenna design process, the continued improvement of new antennas is most limited by the choice of substrate materials. However, development of new materials has proved difficult for a variety of reasons. One reason concerns certain incompatibilities of the physical properties associated with diverse materials that would otherwise be desirable to combine in a single dielectric composition. Often, the thermal coefficient of expansion (TCE), chemical properties of the materials, or sintering properties of the material may be inconsistent with one another. For example, different types of unfired ceramics such as Green Tape™ will not fire well together because of different chemical and physical properties of the various different types of materials.

Still, new materials are needed for a variety of reasons. One such reason relates to the limited variety of specific electrical properties that are offered in commercially available dielectric substrate materials. Designers wishing to implement antennas or other RF circuit designs often find themselves constrained by the limitations of the material. For example, it may be desirable in a particular instance to implement an antenna array on a portion of a substrate having a particular value of permittivity, permeability or loss tangent. The requirements for these electrical properties can relate to form factor, electrical performance or other design issues. In any case, the limited choices of substrate materials that are presently available can require design compromises that are preferably avoided.

SUMMARY OF THE INVENTION

The invention concerns a method for fabricating a ceramic dielectric substrate for an RF circuit. The method can include selecting a substrate pattern and a plurality of ceramic materials to produce a textured substrate having one or more values of desired electrical properties such as permittivity, permeability, or loss tangent. The pattern will consist of a mosaic-like arrangement of dielectric pieces that are generally much smaller than a wavelength at the frequency of interest.

Advantageously, the substrate pattern can be selected for producing a dielectric substrate having one or more effective electrical properties that is different from a bulk electrical property of each individual one of the plurality of ceramic materials. Once the pattern and materials are chosen, the process can include firing the plurality of ceramic materials and cutting each of the plurality of ceramic materials into a selected size and shape to form dielectric pieces consistent with the desired pattern. An adhesive layer can be disposed on a base plate and the dielectric pieces can be arranged on the base plate in accordance with the predetermined pattern. After all the pieces have been placed, the adhesive can be cured to secure the dielectric pieces in place.

Subsequently, the method can include the step of polishing a surface of the substrate to obtain a selected textured substrate thickness. One or more conductive traces can thereafter be disposed on the substrate to define one or more RF circuit elements.

According to another aspect, the invention can include selecting two or more types of ceramic materials, each having a distinct set of electrical properties different from the remainder types of ceramic materials. A substrate pattern can also be selected. The substrate pattern can comprise at least two types of distinct substrate areas having the distinct sets of electrical properties of the ceramic materials. Each distinct area can be selected so as to have dimensions much smaller than a wavelength at a frequency of interest. The ceramic materials can thereafter be fired and then cut into a size and shape consistent with the distinct areas to form dielectric pieces. The process continues by selectively arranging the dielectric pieces on a base plate in accordance with the pattern to form the textured ceramic dielectric substrate. The completed textured substrate will have at least one effective electrical property at a frequency of interest that is different from each of said distinct sets of electrical properties of the ceramic materials.

According to yet another aspect of the invention, the a plurality of layers of the dielectric pieces can be arranged on the base plate. For example the method can include selectively arranging a second layer of the dielectric pieces on the first layer of textured substrate in a second pattern to produce a multiple layer textured substrate. The second pattern can be the same as the first patter, different from the first pattern or the same pattern but physically offset. A dielectric adhesive can be applied between adjacent layers of dielectric pieces to secure the layers together.

DETAILED DESCRIPTION OF THE PREFERRED EMBODIMENTS

Computer modeling has shown that dielectric substrates with tailored electrical properties can be achieved by creating a textured substrate. Textured substrates have a geometric pattern of distinct areas formed within the substrate. The distinct areas can have electrical characteristics such as permittivity, permeability or loss tangent that are different from one another. Because the dimensions of the pattern and the distinct areas are electrically small, the net effect is a substrate that appears to have effective dielectric properties that are actually a blend of those properties of each of the distinct areas. While computer modeling suggests that textured substrate materials hold much promise for future designs, methods for fabrication of textured substrate materials have limited the commercial viability of this approach. The present invention described in relation to FIGS. 1–6 concerns a process for fabricating a textured ceramic substrate with tailored electrical properties.

Figure 1:
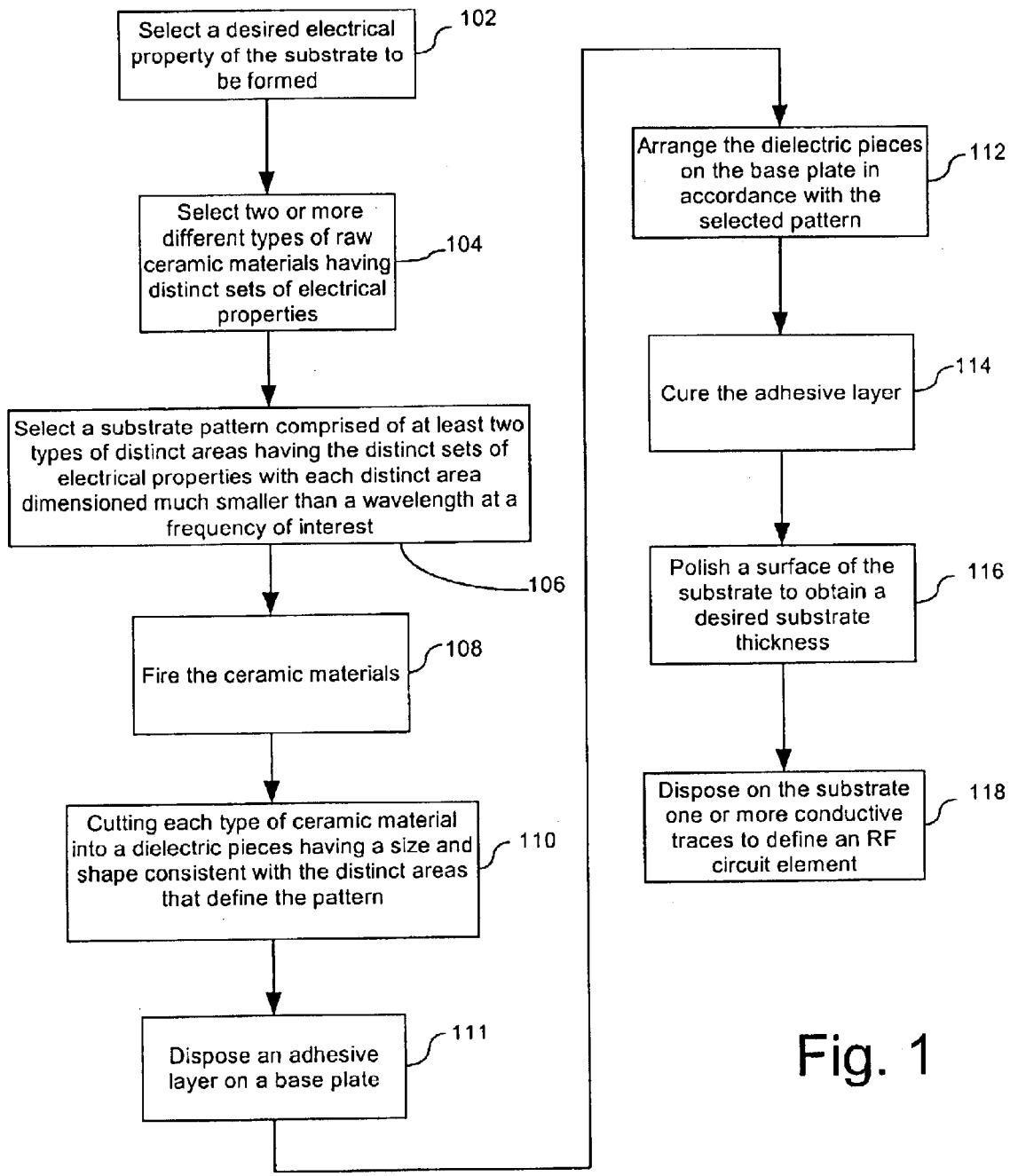
FIG. 1 is a flow chart that is useful for understanding the process for fabricating a ceramic substrate.

A flow chart illustrating the process is shown in FIG. 1. The process can begin with step 102 by selecting one or more effective electrical properties that are desired for the substrate which is to be formed. These can include, without limitation, effective values of permittivity, permeability and loss tangent. In step 104, a plurality of different types of bulk ceramic materials are selected, each having distinct electrical properties. In step 106, the process continues with the selection of a substrate pattern that includes at least two types of distinct areas, each having distinct sets of electrical properties and dimensioned much smaller than a wavelength at a frequency of interest. The ability to predict the outcome of the effective electrical property of a textured substrate at a particular frequency band of interest has just recently become practical with advances in computer modeling and optimization. In general, the pattern selection can include choosing the size, shape and arrangement of two or more different types of dielectrics that are to be combined in a mosaic to obtain a particular effective electrical property.

As used herein, electrical properties include any of several electrical characteristics commonly associated with dielectrics, including permittivity, permeability, and loss tangent. References to "effective electrical properties" are used to distinguish the characteristics exhibited by textured dielectric materials fabricated with the processes described herein. Effective electrical properties of the textured substrate are to be distinguished from the bulk electrical properties of the dielectric materials from which the textured substrates are formed.

Figure 2:
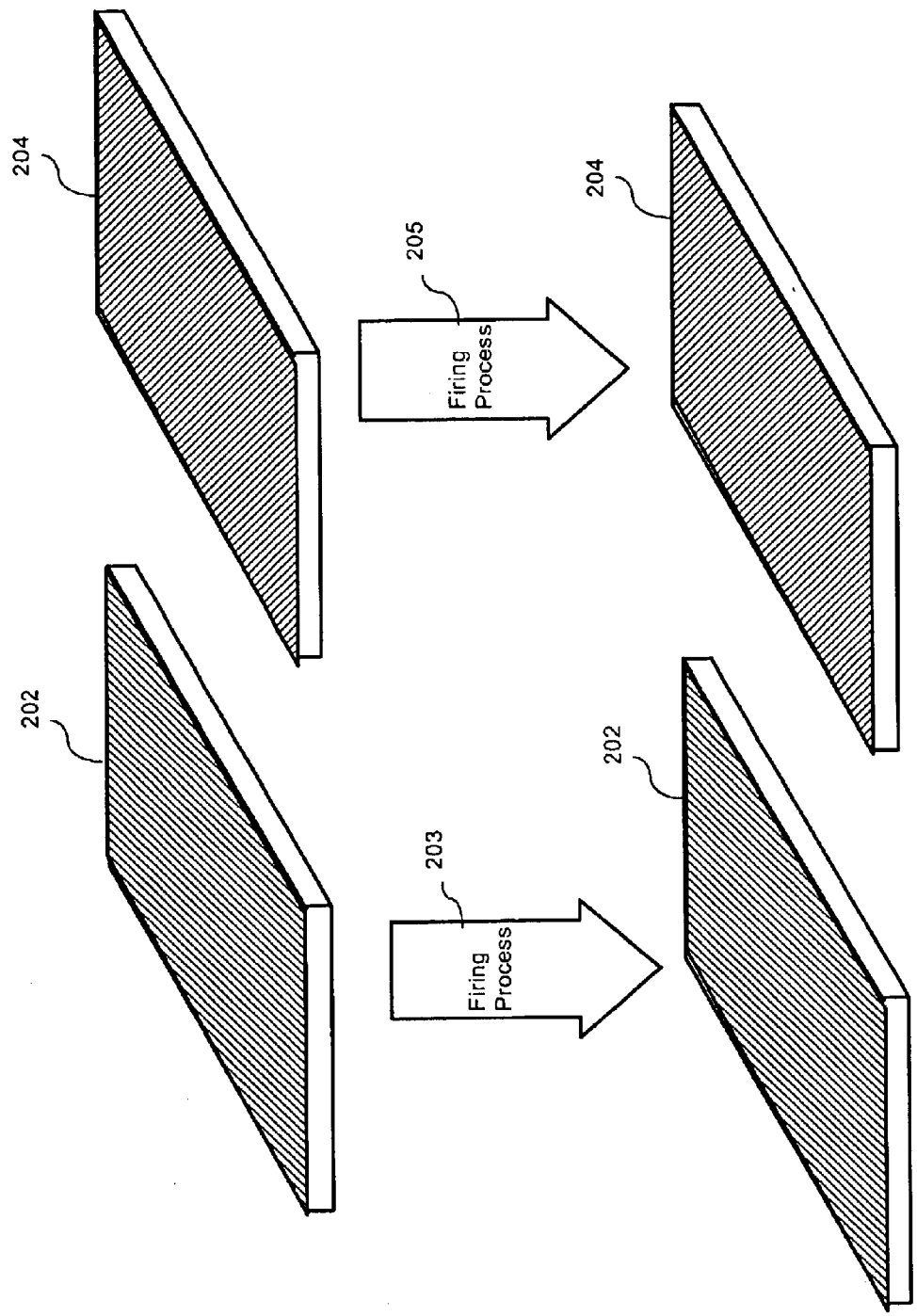
FIG. 2 is a drawing which illustrates bulk sheets of ceramic dielectric material being processed in a firing step.

As shown in FIGS. 1 and 2, the process can continue in step 108 with the firing of two or more different types of ceramic dielectric material sheets 202, 204. Any type of raw ceramic dielectric materials can be used for this purpose.

According to a preferred embodiment, the dielectric material sheets can have a thickness after firing that is approximately equal or slightly larger than the desired dielectric thickness of the completed substrate. Commercially available materials that can be used to form the ceramic dielectric material sheets 202, 204 can include any of a wide variety of different types of low or high temperature ceramics. One example would be low temperature 951 cofire Green Tape™ from Dupont®. The 951 cofire Green Tape™ is Au and Ag compatible, has acceptable mechanical properties with regard to thermal coefficient of expansion (TCE), and relative strength. It is available in thicknesses ranging from 114 $\mu$m to 254 $\mu$m. Other similar types of systems include a material known as CT2000 from W. C. Heraeus GmbH, and A6S type LTCC from Ferro Electronic Materials of Vista, Calif. Any of these materials, as well as a variety of other bulk ceramic materials with different types of electrical properties, can be used.

FIG. 2 shows the two ceramic dielectric material sheets 202, 204 are respectively fired in accordance with the conventional process 203, 205 associated with each type of material. Notably, since each sheet 202, 204 of the ceramic dielectric material is fired separately, the present invention avoids problems associated with matching the CTE and chemical properties of the disparate materials that would otherwise be necessary if dielectric sheets formed from different types of ceramics were fired together.

Figure 3:
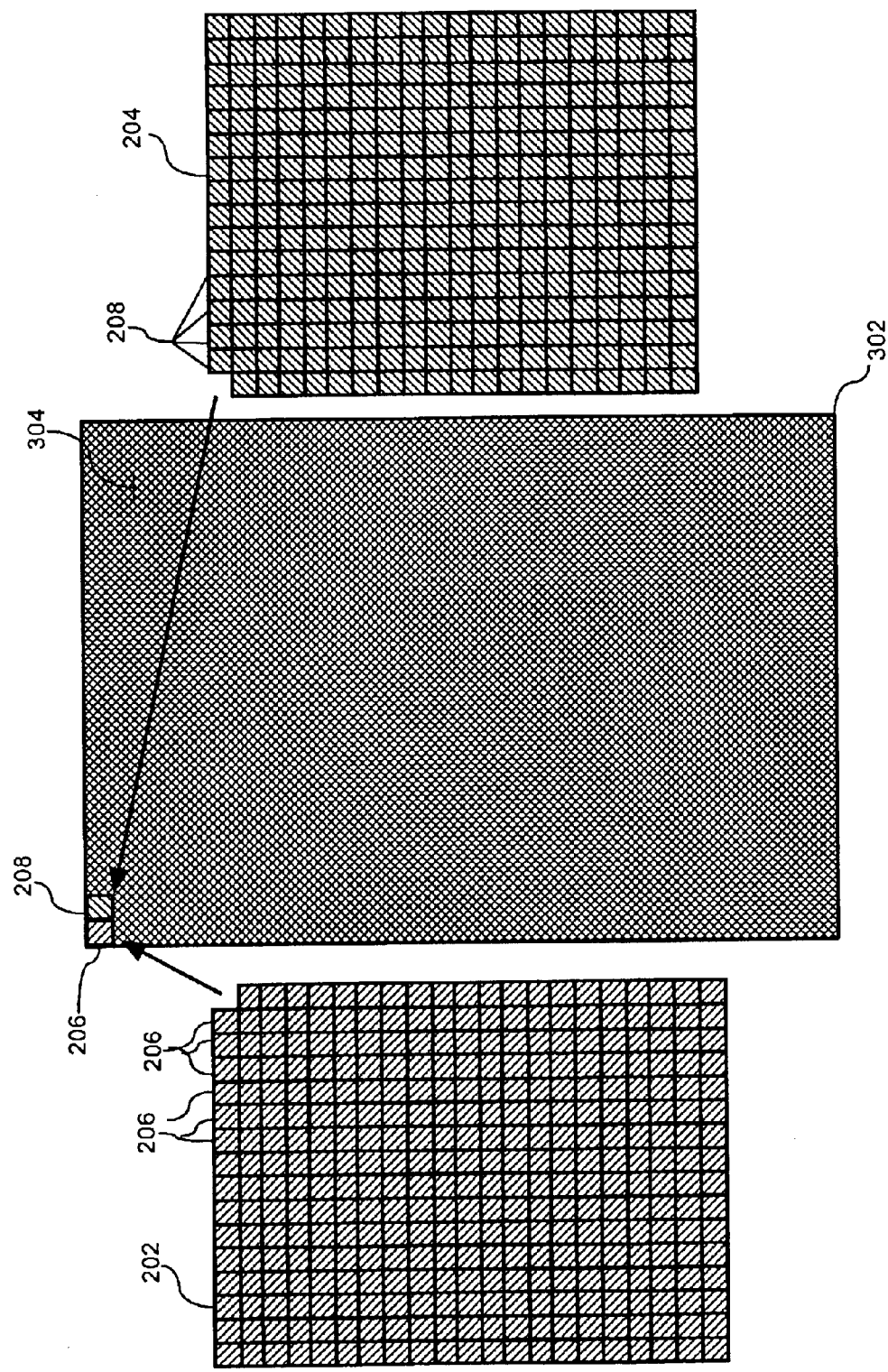
FIG. 3 is a top view of the fired bulk dielectric which has already been cut being placed on a base to create a substrate with a predetermined mosaic pattern.

In step 110, the fired ceramic dielectric material sheets 202, 204 can be automatically cut or diced into a number of small dielectric pieces 206 and 208 as shown in FIG. 3. The size and shape of the pieces are preferably selected to conform to the texture or pattern determined in step 106. In general, however, the dielectric pieces should be electrically small relative to the wavelength of interest for the device in which the completed substrate is to be used. For example, typical length and width of the dielectric pieces can be in a range of between about $\frac{1}{10}$ to $\frac{1}{50}$ of a wavelength, although it should be understood that the invention is not so limited. Also it may be noted that as a matter of convenience, the dielectric pieces 206, 208 in FIG. 3 are shown as having a square shape. However, it should be understood that the process is not so limited and more complex and intricate shapes are also possible.

The automated cutting equipment used to form the dielectric pieces 206, 208 can be provided with the fired ceramic dielectric material sheets 202, 204 as input stock. Thus, ceramic dielectric material sheets having a size of between about 1 inch to 6 inches on each side can be convenient, but the invention is not so limited. The sheets 202, 204 can be cut automatically with a dicing saw such as model no. 984-6 which is available from Kulicke & Soffa of Willow Grove, Pa. Precision automated saws of the kind described herein are more commonly used for singulating silicon semiconductor devices. However, when provided with a cutting blade appropriate for ceramic materials, they are particularly well suited for the present process.

It is desirable to cut the fired ceramic dielectric material sheets 202, 204 in a very precise manner so as to minimize gaps between the dielectric pieces 206, 208 when they are assembled in a pattern to form the substrate. Depending on the thickness of the substrate, gaps of more than a few mills can cause variations in the effective electrical characteristics of the completed substrate. In general, the precision of the cutting process should be selected so that gaps between dielectric pieces are not more than about 10% of the overall thickness of the completed substrate. After cutting, the set of dielectric pieces 206, 208 can be attached to a film adhesive to create a carrier medium to temporarily secure the dielectric pieces in a ordered manner. The set of dielectric pieces 206, 208 can also be optionally placed into a cassette or a suitable platen for a pick and place machine for assembly in the next step of the process.

In step 111, an adhesive layer 304 can be applied to a base plate 302. Base plate 302 can be formed of any suitable base material, depending upon the desired configuration of the substrate. For example the base plate can be a conductor if it is desired to provide a ground plane on one surface of the substrate. Alternatively, the base plate can also be formed of a semiconductor or a dielectric material. The adhesive layer 304 can be an electronic grade epoxy film adhesive. If the base plate 302 is a conductor, it can be advantageous to select a conductive type epoxy film adhesive. For example the adhesive film can be a silver filled epoxy with 70% silver particles.

In step 112, the dielectric pieces 206, 208 are arranged on the base plate 302 in accordance with the selected texture or pattern. In FIG. 3, the beginning of this process is shown with two dielectric pieces 206, 208 placed on the adhesive layer 304 in an alternating pattern. Commercially available computer controlled pick and place machines can be used for this step. Such equipment is commercially available from a variety of sources. The degree of precision required for picking an placing of the dielectric pieces 206, 202-2 will depend on the RF wavelength at the frequency of interest. In general, placement accuracy should be sufficient to ensure that the gap between the dielectric pieces is less than about 0.01 wavelength. Once the dielectric pieces have been placed, it is preferred to avoid sliding the individual pieces to prevent adhesive from inadvertently being pushed between the dielectric pieces. This is especially important if adhesive layer 304 is a conductive adhesive as such irregularities in the ground plane can produce inconsistent electrical properties in the textured substrate.

Figure 5:
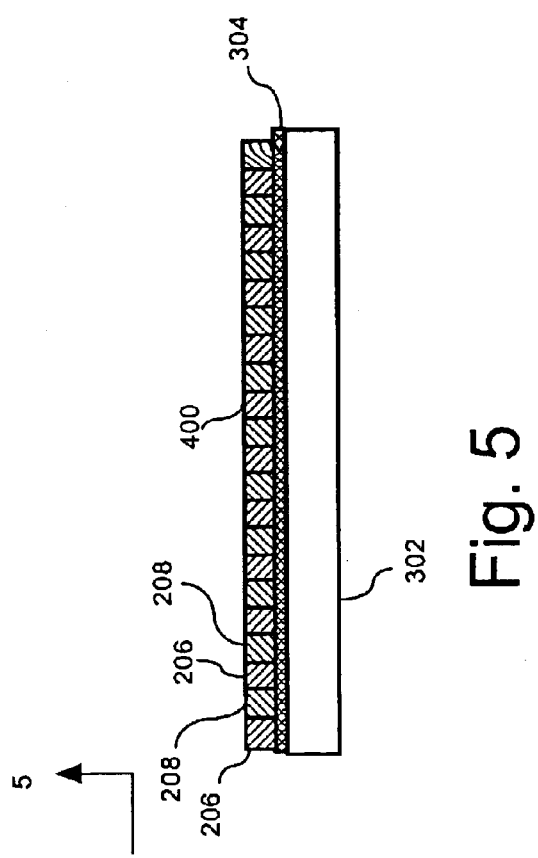
FIG. 5 shows a cross-sectional view of the substrate in FIG. 4 taken along line 5—5.
Figure 4:
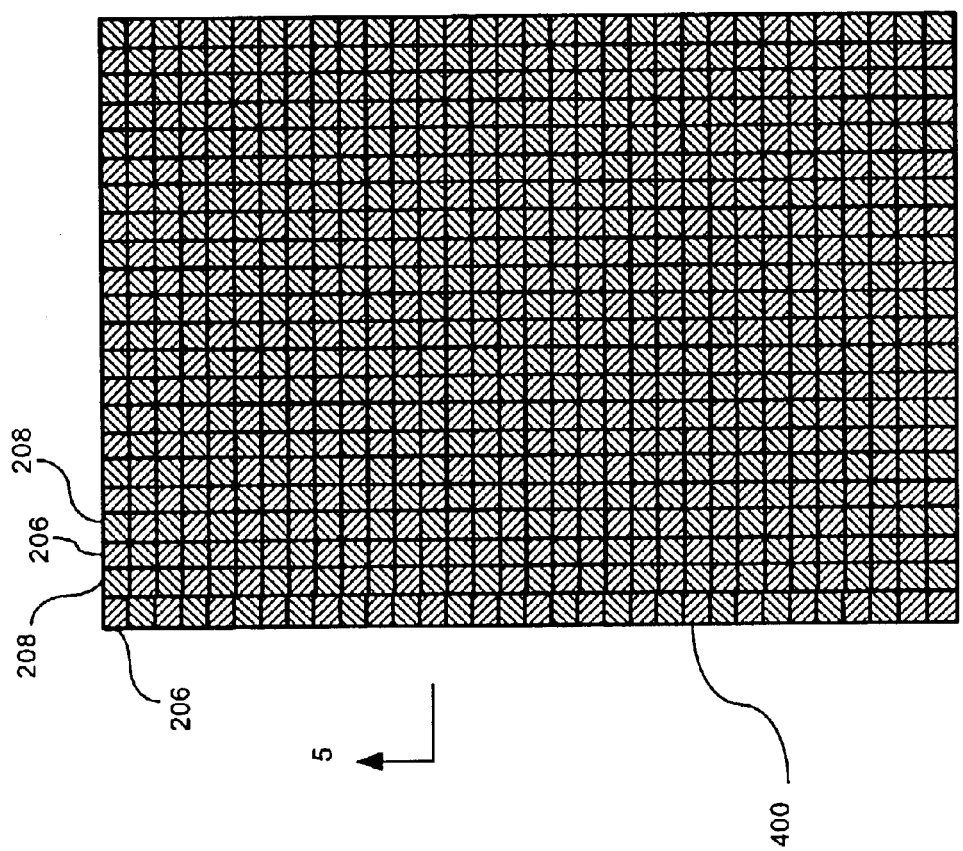
FIG. 4 shows a top view of the substrate after all of the dielectric pieces have been arranged in a predetermined pattern.

FIG. 4 is a top view showing the completed textured substrate 400 with all of the pieces 206, 208 placed on the adhesive layer 304 in an alternating checkerboard pattern following completion of step 112. FIG. 5 is a cross-sectional view of the textured substrate showing adhesive layer 304 and base plate 302. After all of the fired dielectric pieces 206, 208 are placed as shown in FIGS. 4 and 5, the epoxy adhesive layer is cured in step 114 to permanently secure the dielectric pieces in place. Curing time and temperature for the adhesive layer will vary depending on the particular material that is selected.

After the adhesive layer 304 has been cured, the entire textured substrate can be lapped or polished in step 116 to achieve the final thickness of the ceramic dielectric substrate. This step is also useful for smoothing out any irregularities as between the exposed outer surface of all the dielectric pieces to bring them to a consistent height. Polishing is preferably performed by machine using a suitable polishing mediums for the amount of material to be removed. For example, 10 to 40 micron grit wet slurrys have been used effectively for this purpose.

Figure 6:
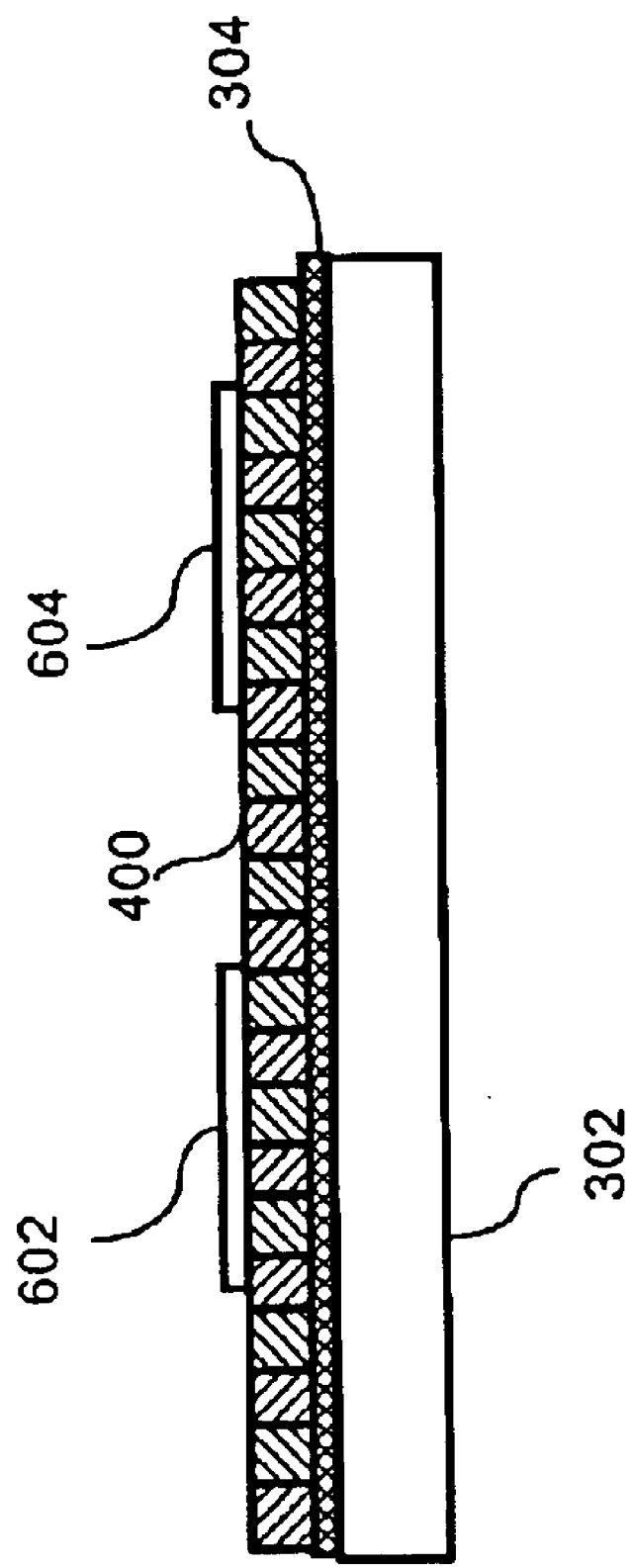
FIG. 6 shows the cross-sectional view of the substrate in FIG. 5 after conductive traces have been formed on the surface.

In step 118, one or more conductive elements 602, 604 can be screen printed on the textured substrate 400 as shown in FIG. 6. The screen printing on the array can be performed using a conventional electronics grade conductive epoxy or ink that cures in the 100 degree to 125 degree range.

Those skilled in the art will appreciate that while the invention has been described herein in the form of a single textured layer of dielectric, the invention is not so limited. The process of cutting and placing pieces as described herein can be repeated. In this way, additional textured layers can be stacked or arranged one above the other to provide texture variation along a z-axis or vertical axis that is orthogonal to the base plate. A dielectric adhesive can be disposed between layers to secure the multiple layers together. In any case, this additional design variable can provide a further control over the substrate which can be optimized to produce a particular desired effective dielectric property.

We claim:

1. A method for fabricating a ceramic dielectric substrate for an RF circuit comprising the steps of:
   firing a plurality of ceramic materials;
   after said firing step, cutting each of said plurality of ceramic materials into a selected size and shape to form dielectric pieces;
   selectively arranging said dielectric pieces on a base plate in a pattern to produce a textured substrate having at least one effective electrical property at a frequency of interest that is different from a bulk electrical property of each individual one of said plurality of ceramic materials.

2. The method according to claim 1 further comprising the step of disposing an adhesive layer between said base plate and said dielectric pieces.

3. The method according to claim 2 further comprising the step of curing said adhesive layer.

4. The method according to claim 3 further comprising the step of polishing a surface of said textured substrate to obtain a selected substrate thickness.

5. The method according to claim 4 further comprising the step of disposing on said textured substrate at least one conductive trace to define an RF circuit element.

6. The method according to claim 1 further comprising the step of selecting said pattern and said plurality of ceramic materials to produce said desired electrical property.

7. The method according to claim 1 further comprising the step of selecting said electrical property from the group consisting of permittivity, permeability, and loss tangent.

8. The method according to claim 1 further comprising the step of selecting a process for cutting each of said plurality of ceramic materials and arranging said dielectric pieces on said base plate to minimize any gaps between edges of adjacent ones of said dielectric pieces.

9. The method according to claim 1 further comprising the step of selecting at least one of said size and shape of said pieces based on an RF frequency of interest.

10. The method according to claim 1 further comprising the step of selecting said pattern based on an RF frequency of interest.

11. The method according to claim 1 further comprising the step of selecting said ceramic materials to be a glass/ceramic tape.

12. The method according to claim 11 further comprising the step of selecting said ceramic material to be a low temperature cofire ceramic tape.

13. The method according to claim 1 further comprising the step of cutting said dielectric pieces to be electrically small relative to a wavelength of an RF frequency of interest.

14. The method according to claim 1 further comprising the step of selectively arranging a second layer of said dielectric pieces on said textured substrate in a second pattern to produce a multiple layer textured substrate.

15. The method according to claim 14 further comprising the step of applying an adhesive between adjacent layers of said dielectric pieces.

16. A method for fabricating a textured ceramic dielectric substrate for an RF circuit comprising the steps of:

selecting a plurality of ceramic materials, each of said plurality of ceramic materials having a distinct set of electrical properties different from a remainder of said ceramic materials;

selecting a pattern comprised of at least two types of distinct areas having said distinct sets of electrical properties and each distinct area dimensioned much smaller than a wavelength at a frequency of interest;

firing said plurality of ceramic materials;

after said firing step, cutting each of said plurality of ceramic materials into a size and shape consistent with said distinct areas to form dielectric pieces;

selectively arranging said dielectric pieces on a base plate in accordance with said pattern to form said textured ceramic dielectric substrate having at least one effective electrical property at a frequency of interest that is different from each of said distinct sets of electrical properties.

17. The method according to claim 16 wherein said arranging step further comprises forming a single layer of said dielectric pieces on said base plate in accordance with said pattern.

18. The method according to claim 16 wherein said arranging step further comprises stacking a plurality of layers of said dielectric pieces on said base plate.

19. The method according to claim 18 further comprising the step of selecting at least a second pattern for said dielectric pieces for at least a second one of said plurality of layers.

20. The method according to claim 16 further comprising the step of screen printing at least one RF circuit element on said textured ceramic dielectric substrate.

21. The method according to claim 16 further comprising the step of disposing a layer of adhesive on said base plate prior to said arranging step.

22. The method according to claim 21 further comprising the step of curing said adhesive layer in a heating step.

23. The method according to claim 21 further comprising the step of screen printing at least one RF circuit element on said textured ceramic dielectric substrate.

24. The method according to claim 16 further comprising arranging said dielectric pieces using a computer controlled pick and place machine.

25. The method according to claim 24 further comprising the step of screen printing at least one RF circuit element on said textured ceramic dielectric substrate.

26. The method according to claim 16 further comprising the step of polishing a surface of said textured ceramic dielectric substrate.

27. The method according to claim 26 further comprising the step of screen printing at least one RF circuit element on said textured ceramic dielectric substrate.

* * * * *

UNITED STATES PATENT AND TRADEMARK OFFICE
CERTIFICATE OF CORRECTION

PATENT NO. : 6,770,159 B1 Page 1 of 1
DATED : August 3, 2004
INVENTOR(S) : Tebbe et al.

It is certified that error appears in the above-identified patent and that said Letters Patent is hereby corrected as shown below:

Column 8,
Line 18, delete "24" and replace with -- 16 --.

Signed and Sealed this

Third Day of January, 2006

JON W. DUDAS
*Director of the United States Patent and Trademark Office*